United States Patent
Yoshida et al.

(10) Patent No.: US 9,293,320 B2
(45) Date of Patent: Mar. 22, 2016

(54) LIQUID TREATMENT APPARATUS AND METHOD AND NON-TRANSITORY STORAGE MEDIUM

(71) Applicant: Tokyo Electron Limited, Tokyo (JP)

(72) Inventors: Yuichi Yoshida, Tokyo (JP); Kousuke Yoshihara, Tokyo (JP)

(73) Assignee: Tokyo Electron Limited, Minato-Ku (JP)

( * ) Notice: Subject to any disclaimer, the term of this patent is extended or adjusted under 35 U.S.C. 154(b) by 18 days.

(21) Appl. No.: 13/865,311

(22) Filed: Apr. 18, 2013

(65) Prior Publication Data

US 2013/0280425 A1    Oct. 24, 2013

(30) Foreign Application Priority Data

Apr. 23, 2012   (JP) ................. 2012-098079

(51) Int. Cl.
| | |
|---|---|
| *H01L 21/02* | (2006.01) |
| *H01L 21/67* | (2006.01) |
| *G03F 7/16* | (2006.01) |
| *G03F 7/30* | (2006.01) |
| *G03F 7/32* | (2006.01) |

(52) U.S. Cl.
CPC .......... *H01L 21/02104* (2013.01); *G03F 7/162* (2013.01); *G03F 7/3021* (2013.01); *G03F 7/325* (2013.01); *H01L 21/02052* (2013.01); *H01L 21/6715* (2013.01); *H01L 21/67017* (2013.01); *H01L 21/67051* (2013.01)

(58) Field of Classification Search
USPC ....................... 427/240, 427.7; 118/300, 313
See application file for complete search history.

(56) References Cited

U.S. PATENT DOCUMENTS

| | | |
|---|---|---|
| 2005/0180744 A1 | 8/2005 | Nakamura et al. |
| 2009/0291198 A1* | 11/2009 | Yoshihara et al. ............... 427/8 |
| 2011/0200321 A1* | 8/2011 | Takiguchi et al. ............ 396/577 |
| 2013/0068324 A1 | 3/2013 | Furusho et al. |

FOREIGN PATENT DOCUMENTS

| | | |
|---|---|---|
| JP | 11-319682 A1 | 11/1999 |
| JP | 2005-166843 A1 | 6/2005 |
| JP | 2007-299941 | 11/2007 |
| JP | 2011-238666 A1 | 11/2011 |
| WO | WO2011138881 | * 11/2011 |

OTHER PUBLICATIONS

Japanese Office Action (Application No. 2012-098079) dated Mar. 3, 2015.

* cited by examiner

*Primary Examiner* — Nathan T Leong
(74) *Attorney, Agent, or Firm* — Burr & Brown, PLLC

(57) ABSTRACT

A liquid treatment method includes: supplying a first organic solvent to a substrate with the substrate being held horizontally by a substrate holder; and thereafter supplying a second organic solvent to a substrate held by the substrate holder, the second solvent having a higher cleanliness than the first solvent.

9 Claims, 8 Drawing Sheets

US 9,293,320 B2

LIQUID TREATMENT APPARATUS AND METHOD AND NON-TRANSITORY STORAGE MEDIUM

CROSS REFERENCE TO RELATED APPLICATION

This application is based on and claims the benefit of priority from Japanese Patent Application No. 2012-098079 filed on Apr. 23, 2012, the entire contents of which are incorporated herein by reference.

TECHNICAL FIELD

The embodiments disclosed herein relate to a technique for performing a liquid treatment to a substrate by supplying an organic solvent to the substrate.

BACKGROUND ART

Semiconductor device manufacturing processes include a liquid treatment process using a chemical liquid. In some cases, an organic solvent is used as the chemical liquid. For example, the liquid treatment process may be a pre-wet process that supplies an organic solvent to a surface of a semiconductor wafer (hereinafter referred to simply as "wafer") before supplying a resist solution (See JP2007-299941A, for example). An organic solvent also may be used in a developing process.

Recently, circuit patterns have become finer and finer. It is thus expected that ultra-small foreign matters (e.g., particles) may affect adversely the device yield. Such particles may be foreign matters which are originally included in the organic solvent, or foreign matters or ionized metals which are originated from the transport passage materials and mixed into the organic solvent during transportation from a solvent tank through a passage.

Improving the cleanliness of a treatment liquid to be supplied to the wafer may be one possible measure for reducing an amount of particles remaining on a wafer after completion of a wet process (liquid treatment process). The cleanliness of a treatment liquid may be improved by optimizing the filtering condition, or by repeating cycle filtration. However, the filtration rate often must be set to be the same as the process liquid supply rate, and thus cannot be set to be an optimum value. Since there is a trade-off between the throughput of the filter and the filtration accuracy of the filter, it is difficult to determine an optimum filtering condition that meets both the filtration accuracy and the supply rate of the filtered treatment liquid per unit time which are required for the liquid treatment process.

SUMMARY OF THE INVENTION

The embodiments disclosed herein are directed to a technique that can reduce an amount of foreign matter remaining on a substrate while suppressing throughput loss, when a liquid treatment process is performed to the substrate by supplying an organic solvent to the substrate.

In one embodiment, there is provided a liquid treatment apparatus including: a substrate holder configured to hold a substrate horizontally; at least one nozzle configured to supply an organic solvent to a substrate held by the substrate holder; a first organic solvent supply mechanism configured to supply a first solvent to said at least one nozzle; a second organic solvent supply mechanism configured to supply a second solvent to said at least one nozzle, the second solvent having a higher cleanliness than the first solvent; and a controller configured to control the first and second organic solvent supply mechanisms such that said at least one nozzle supplies a substrate with the first organic solvent and then supplies the substrate with the second organic solvent.

In another embodiment, there is provided a liquid treatment method including: supplying a first organic solvent to a substrate with the substrate being held horizontally by a substrate holder; thereafter supplying a second organic solvent to a substrate held by the substrate holder, the second solvent having a higher cleanliness than the first solvent.

In yet another embodiment, there is provided a non-transitory storage medium storing a computer program, wherein upon execution of computer program by a control computer of a liquid treatment apparatus, the liquid treatment apparatus performs the above liquid treatment method under the control of the control computer.

DETAILED DESCRIPTION OF THE INVENTION

Figure 1:
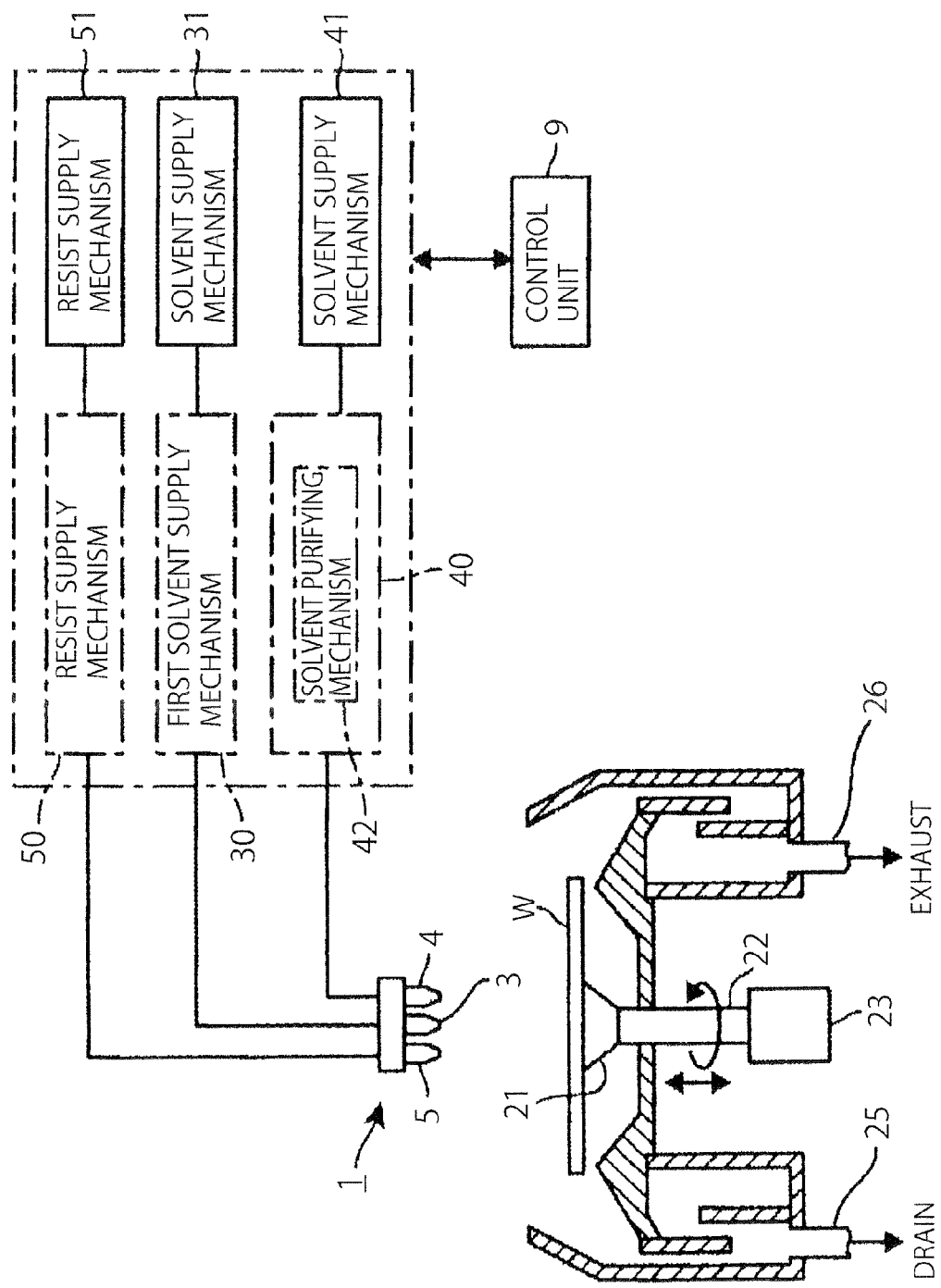
FIG. 1 is a schematic configuration diagram of a resist coating apparatus, as one embodiment of a liquid treatment apparatus.

A resist coating apparatus, which is an embodiment of a liquid treatment apparatus, will be described below. As shown in FIG. 1, the resist coating apparatus includes: a nozzle unit 1 having two solvent nozzles 3 and 4 each for discharging an organic solvent (hereinafter referred to simply as "solvent") and a resist nozzle 5 for discharging a resist solution; solvent supply sources 31, 41 and a resist supply source 51 and solvent supply mechanisms 30, 40 and a resist supply mechanism 50 provided in correspondence to the nozzles 3, 4 and 5, respectively; and a control unit 9 that controls the operation (including the operation for a series of liquid treatment processes, described later) of the resist coating apparatus.

The resist coating apparatus further includes a liquid treatment module 2, which includes a spin chuck 21, which is a substrate holding unit that holds the central portion of the back surface of a wafer W by suction to retain the wafer W horizontally. The spin chuck 21 is connected to a rotating mechanism 23 via a rotary shaft 22. A cup body 24 (in detail, a cup assembly) having an upper opening is provided around the spin chuck 21 to surround the wafer W held by the spin chuck 21. The cup body 24 receives a solvent that is spun off from the wafer W, and drains the received solvent therefrom through a drain passage 25. The interior of the cup body 24 is exhausted through an exhaust passage 26 to prevent mist from scattering into the process atmosphere.

Figure 2:
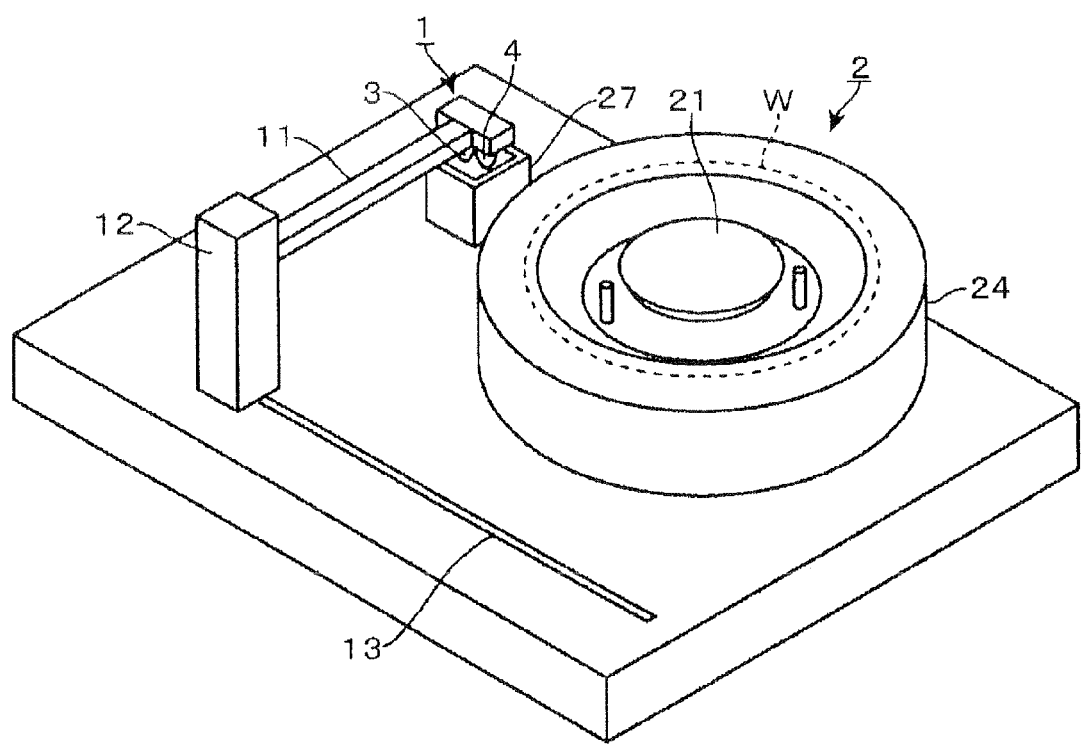
FIG. 2 is a perspective view of the resist coating apparatus shown in FIG. 1.

As shown in FIG. 2, the nozzle unit 1 is driven by a moving mechanism, which includes an arm 11, a moving body 12, an elevating mechanism (not shown) and a guide rail 13, so that the nozzle unit 1 is moved to a discharge position above the central portion of the wafer W and a standby area 27 outside the cup body 24. The solvent nozzles 3 and 4 of the nozzle unit 1 are provided to supply a solvent to a wafer before the wafer W is supplied with a resist solution, so as to perform a pre-wet process that facilitates spreading of the resist solution over the wafer W.

Next, the solvent supply sources 31 and 41 and the solvent supply mechanisms 30 and 40 are described. The solvent that passes through the solvent supply mechanism 30 to be supplied to the solvent nozzle 3 is referred to as "first solvent", and the solvent supply mechanism 30 is referred to as "first solvent supply mechanism 30", hereinafter. The solvent that passes through the solvent supply mechanism 40 to be supplied to the solvent nozzle 4 is referred to as "second solvent", and the solvent supply mechanism 40 is referred to as "second solvent supply mechanism 40", hereinafter.

Figure 3:
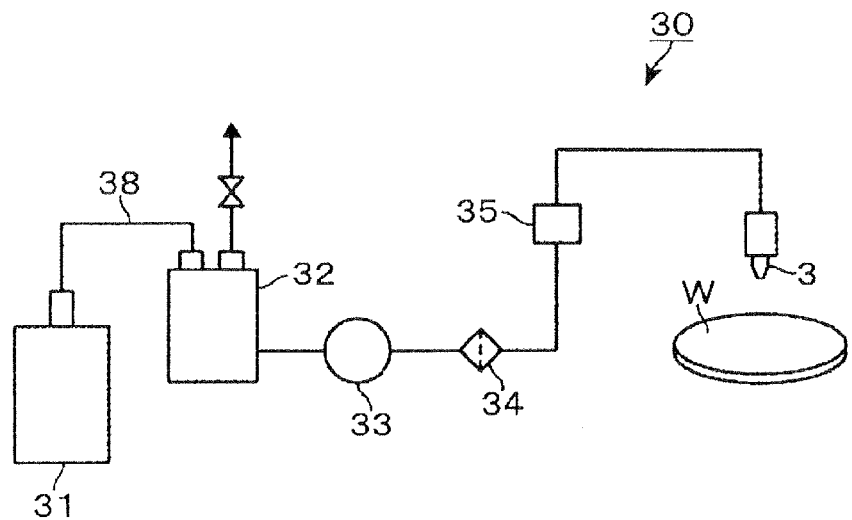
FIG. 3 is a schematic configuration diagram of a first solvent supply mechanism shown in FIG. 1.

As shown in FIG. 3, the first solvent supply mechanism 30 includes: a solvent tank 31 serving as a solvent supply source; an intermediate tank 32 for temporarily storing the solvent; a pump 33; a filter unit 34; and a flow control valve 35, which are arranged in that order from the upstream side of a supply line 38. A filter element comprising nylon or polyethylene or the like is provided in the filter unit 34 to remove particles. The filter unit 34 is capable of removing particles of about 50 nm (nanometer) size. The intermediate tank 32, the pump 33 and the filter unit 34 are each provided with a vent valve (not shown), so that gases dissolving in the solvent can be degassed (removed) by opening the vent valve.

Figure 4:
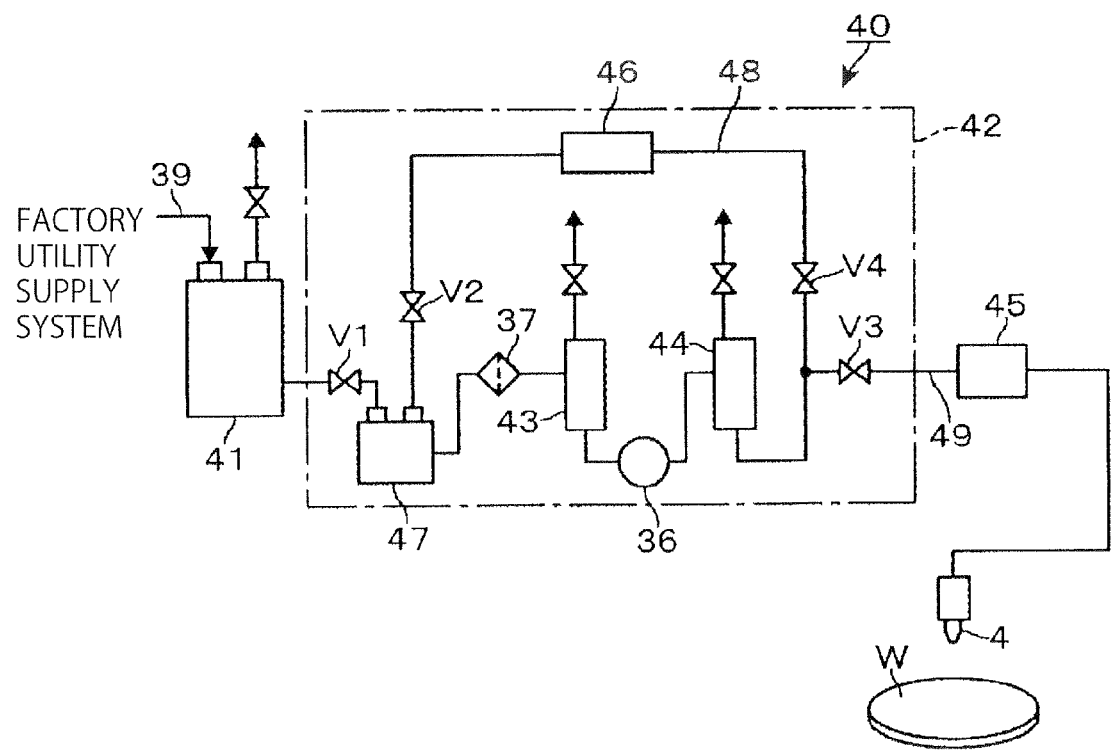
FIG. 4 is a schematic configuration diagram of a second solvent supply mechanism shown in FIG. 1.

As shown in FIG. 4, the second solvent supply mechanism 40 has an intermediate tank 41 serving as the solvent supply source, to which a solvent is supplied through a pipeline 39 from a utility supply room of the factory outside the resist coating apparatus. Provided on a supply line 49 extending from the intermediate tank 41 to the second solvent nozzle 4 are: a valve V1; a circulation tank 47 (described later); a filter unit 37; a trap 43; a pump 36; a trap 44; a valve V3; and a flow control valve 45, which are arranged in that order from the upstream side. The second solvent nozzle 4 is connected to the flow control valve 45. One end of a circulation line 48, comprising a pipeline for example, is connected to the supply line 49 at a position downstream of the trap 44 and upstream of the flow control valve 45. The other end of the circulation line 48 is connected to the circulation tank 47 upstream of the filter unit 37. The circulation line 48 is provided thereon with a valve V4, a flow control valve 46 and a valve V2 which are arranged in that order from the trap 44 side to the circulation tank 47 side.

Figure 5:
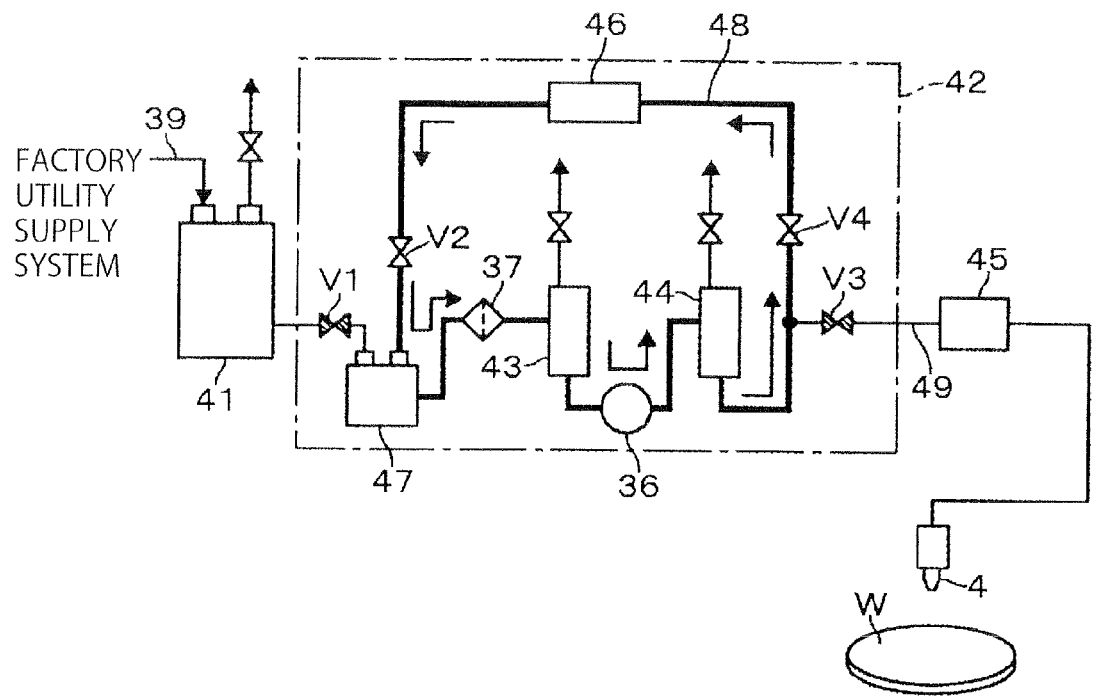
FIG. 5 is the diagram of FIG. 3 indicating the status where an organic solvent is being purified.

As shown in FIG. 5, when the solvent is circulated, the solvent flows through a part of the supply line 49 extending from an upstream junction located upstream of the filter unit 37 (at the circulation tank 47) to a downstream junction located downstream of the trap 44 and flows also through the circulation line 48. This looped passage through which the solvent flows is referred to "circulation passage", whose definition is different from the circulation line 48. In this embodiment, the circulation passage and the devices provided thereon serve as a solvent purifying mechanism 42.

The trap 44 is provided to remove relatively large bubbles which cannot be removed by the not-shown vent valve in the filter unit 37. The trap 44 is provided to remove gases which may possibly remain in the pump 36.

The resist supply mechanism 50 has a pipeline provided thereon with devices such as a pump, a valve, a filter and so on, and is configured to supply a predetermined amount of a resist solution to be discharged from the resist nozzle 5.

Returning to FIG. 1, the resist coating apparatus has the control unit 9 comprising a computer. The control unit 9 has a program storage part, in which programs specifying commands for operation, such as transferring of a wafer W between an external transfer arm (not shown) and the spin chuck 21, rotating of the spin chuck 21, a sequence of supplying the solvent and the resist solution, and so on. The program is installed in the control unit 9 while the program is stored in a non-transitory storage medium such as a flexible disk, a compact disk, a hard disk drive, a magnetooptical disk, a memory card.

The operation of the resist coating apparatus is described. First, a wafer W is transferred by the not-shown external transfer arm to the spin chuck 21, and the wafer W is held by the spin chuck 21. Then, the wafer W is rotated about a vertical rotation axis at a rotation speed of 500 rpm, for example, and the nozzle unit 1 is moved such that the first solvent nozzle 3 is located right above the central portion of the wafer W.

Figure 6:
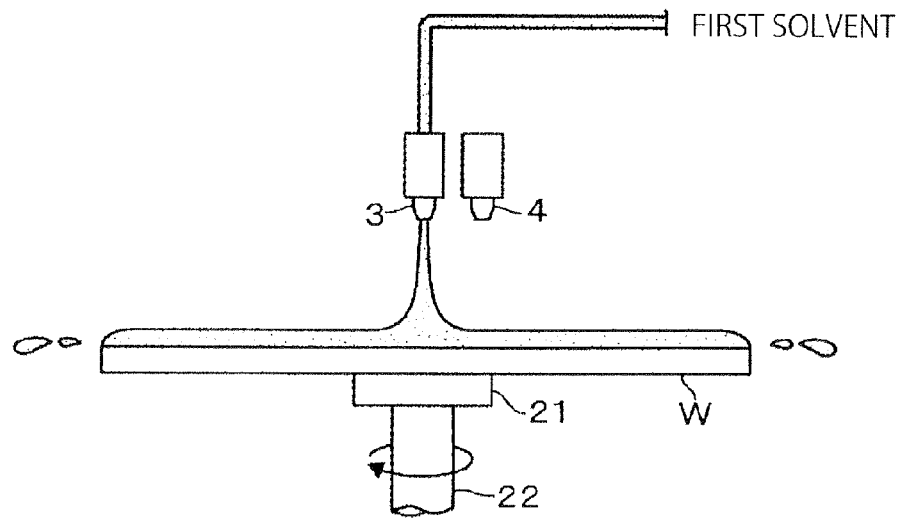
FIG. 6 is a schematic side view showing a first pre-wetting step.

In the solvent supply mechanism, the solvent supplied from the first solvent tank 31 is temporarily stored in the intermediate tank 32, and then is fed by the pump 33 to the filter unit 34, in which particles larger than the aperture size of the filter element are removed. The first solvent fed by the pump 33 is supplied to the wafer W from the first solvent nozzle 3 at a predetermined flow rate controlled by the flow control valve 35. A total amount of the first solvent supplied to the wafer W is 1.5 ml (milliliters), for example. As illustrated in FIG. 6 showing this situation, the first solvent gradually spreads outward toward the periphery of the wafer W due to centrifugal force.

Immediately after supplying the first solvent, the nozzle unit 1 moves such that the second solvent nozzle 4 is located right above the central portion of the wafer W. The wafer W is kept rotating at a low rotation speed.

The processing of the second solvent before it is supplied from the second solvent nozzle 4 is described below. In the second solvent supply mechanism 40, a solvent is fed from the utility supply room of the factory through the pipeline 39 to the intermediate tank 41, and then fed to the circulation tank 47. When the resist coating apparatus is set up, the second solvent supply mechanism 40 including the circulation path 48 is filled with the solvent. As shown in FIG. 5, the valves V1 and V3 are closed; the valves V2 and V4 are opened, and the pump 36 is operated, so that the solvent circulates through the circulation path 48. In detail, the solvent flows through the circulation passage (loop), passing through the circulation tank 47, the filter unit 37, the trap 43, the pump 36, the trap 44, the flow control valve 46 and the circulation tank 47 in that order. The solvent circulates through the circulation passage fifty times, for example.

The solvent is thus filtered plural times repeatedly, so that the cleanliness of the solvent is improved. For example, during the first passage of the solvent through the filter unit 37, relatively large particles of about 70 nm size cannot pass the filter unit 37 and are trapped by the filter unit 37; while relatively small particles of about 40 nm size (smaller than the aperture size) can pass through the filter unit 37. However, some of such small particles may adhere to the filter unit 37 due to intermolecular force if they pass through the filter unit 37 repeatedly. The total number of the small particles adhering to the filter unit 37 increases as the number of the passage of the small particles through the filter unit 37 increases. In addition, adhesion of the particles results in decreasing of the effective aperture size, so that the filter unit 37 can trap smaller particles. In this way, small particles, which cannot be removed from the solvent by one passage through the filter unit 37, can be removed at a high removal rate.

Figure 7:
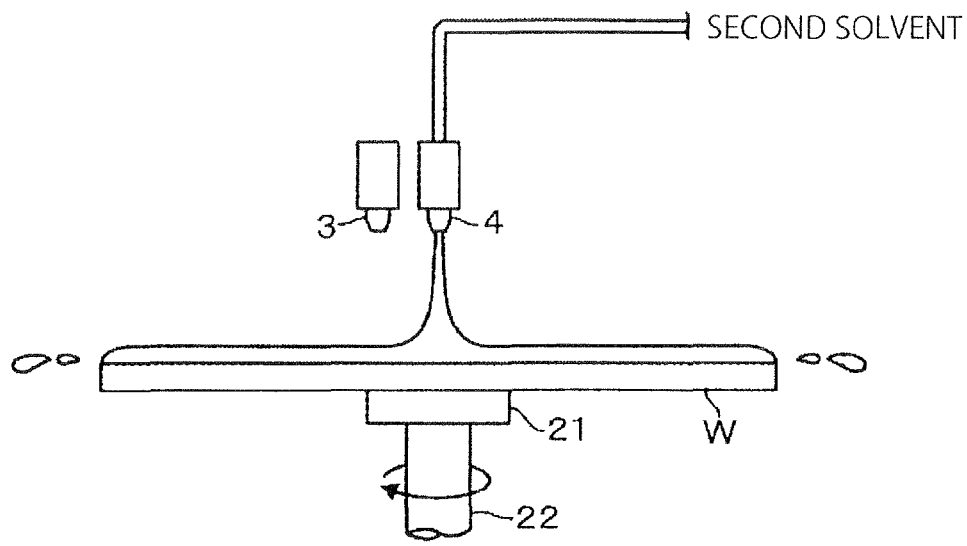
FIG. 7 is a schematic side view showing a second pre-wetting step.

Next, the pump 36 is stopped, the valves V2 and V4 are closed; the valves V1 and V3 are opened. Then, the pump 36 is operated, so that the second solvent having a high cleanliness is ejected from the second solvent nozzle 4 onto the wafer W. Also in this case, the second solvent is ejected at a flow rate controlled by the flow control valve 45. As mentioned above, the second solvent nozzle 4 supplies 1.0 milliliters of the second solvent onto the central portion of the wafer W, immediately after the second solvent nozzle 4 is moved to a position right above the central portion of the wafer W. As shown in FIG. 7, similar to the first solvent, the second solvent spreads from the central portion toward the periphery of the wafer W, so that the second solvent pushes the first solvent toward the periphery of the wafer W.

Since the first solvent has passed the filter unit 34 only once, small particles remain in the first solvent. On the other hand, the second solvent has passed the filter unit 37 plural times via the circulation path 48, even small particles have been removed from the second solvent. When the second solvent having higher cleanliness is supplied after supplying the first solvent, the second solvent pushes the particles, together with the first solvent, toward the periphery of the wafer W. Thus, after supplying the second solvent, the number of particles remaining on the wafer W is small.

Figure 8:
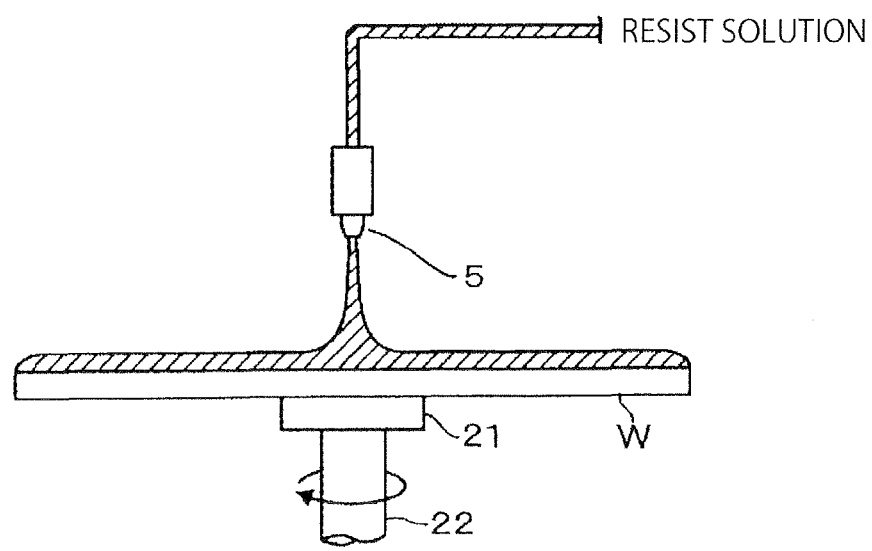
FIG. 8 is a schematic side view showing a resist coating step.

After completion of the pre-wet process, as shown in FIG. 8, the resist nozzle 5 is moved to a position right above the central portion of the wafer W, and the resist nozzle 5 ejects the resist solution onto the rotating wafer W whose rotation speed is increased up to a rotation speed suitable for resist coating. Since the surface of the wafer W is wetted with the solvent, the resist solution spreads over the whole surface of the wafer W with high uniformity, so that a uniform resist film can be formed.

The step of repeatedly circulating the solvent to purify the solvent is preferably preformed when the operation of the resist coating apparatus is stopped, for example, when the resist coating apparatus is stopped for maintenance work, or when the treatment in the resist coating apparatus is temporarily stopped for a relatively long interval time between two production lots. When the resist solution is to be applied to wafers W, the purified solvent stored in the circulation tank 47 is supplied to wafers W. If the purified solvent in the circulation tank 47 is running short when wafers W are moving down in the production line in the resist coating apparatus, purification of the solvent must be done. The resist coating process thus must be stopped for a certain period of time. However, in the foregoing embodiment, since the first solvent having a lower purification level and the second solvent having a higher purification level are used for pre-wetting, an amount of consumption of the second solvent can be reduced (For example, if 2.5 milliliters of solvent in total is required for pre-wetting, 1.0 milliliters of second solvent is used). Therefore, since the consumption rate of the second solvent stored in the circulation tank 47, serving as a buffer tank, is low, the frequency of the solvent purifying operation can be reduced. In addition, an amount of the second solvent to be generated can be reduced. As a result, the stopping time of the resist coating apparatus in total can be reduced, suppressing reduction of throughput of the resist coating apparatus.

In the forgoing embodiment, after the first solvent having a relatively low cleanliness is supplied to the wafer W placed in the liquid treatment module 2, the purified second solvent having a high cleanliness is supplied to the wafer W. Thus, foreign matter remaining on the wafer W can be reduced, while the amount of consumption of the highly-purified second solvent is reduced. Further, reduction of throughput of the resist coating apparatus is suppressed, as mentioned above.

Figure 9:
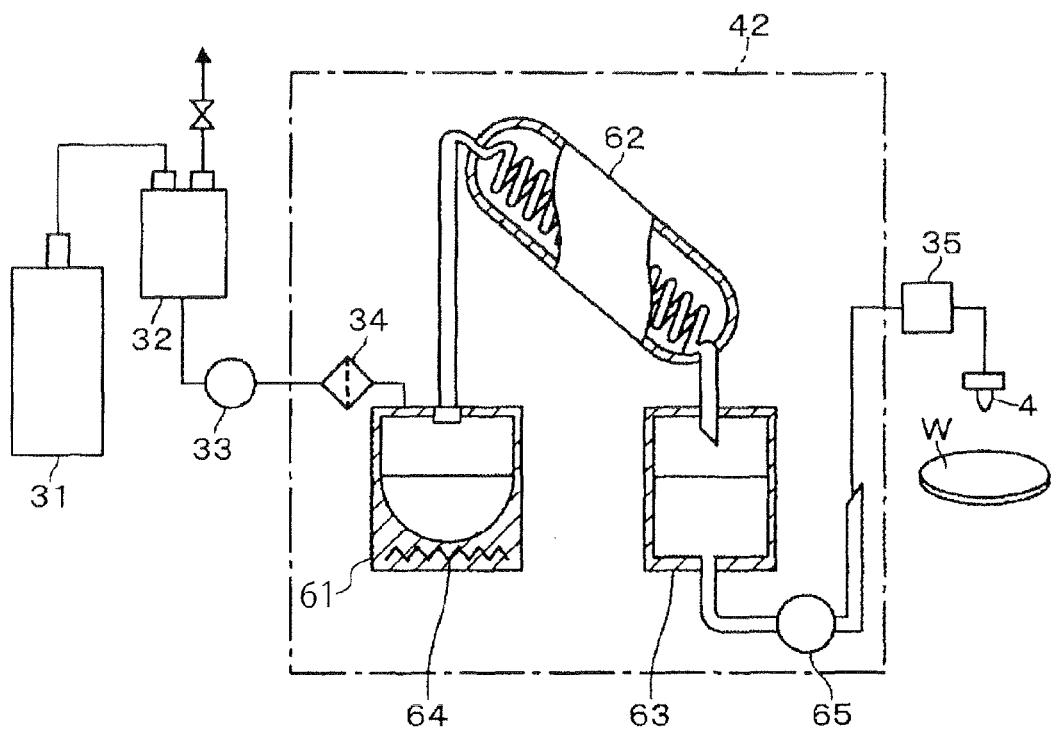
FIG. 9 is a schematic configuration diagram of a second solvent supply mechanism in another embodiment.

The solvent purifying mechanism 42 may be configured to distill a solvent for purification. For example, PGMEA (Propylene Glycol Methyl Ether Acetate) and PGME (Propylene Glycol Monomethyl Ether) may be used as a pre-wetting liquid, and may be purified via distillation. FIG. 9 shows another configuration of a solvent purifying mechanism 42', which differs from the solvent purifying mechanism 42 shown in FIG. 3 in the following respects. A distillation tank 61 is provided downstream of the filter unit 34. The distillation tank 61 is provided therein with a heating unit 64, which is capable of heating a solvent existing in the distillation tank 61 up to a fixed temperature higher than the boiling point (boiling temperature). A cooling unit 62 is provided at an upper portion in the distillation tank 61. The cooling unit 62 includes a spiral inner tube, and an outer tube that houses the inner tube to allow cooling water to flow through a space around the inner tube. The cooling unit 62 cools the solvent vapor flowing through the inner tube to be condensed (liquefied).

A storage tank 63 is provided below the outlet of the cooling unit 62 to recover the solvent liquefied in the cooling unit 62. Through distillation, foreign matter (e.g., particles, ionized metals) contained in the solvent is removed from the solvent, so that the solvent has a high cleanliness. The second solvent having a high cleanliness stored in the storage tank 63 is supplied onto a wafer W from the solvent nozzle 4 by the pump 64. Also in this way, a solvent can be purified to have a high cleanliness.

Incidentally, in the solvent supply mechanism 30 as shown in FIG. 3, the cleanliness of the solvent can be improved by reducing the flow rate of the solvent, i.e., reducing the passing speed at which the solvent passes through the filter unit 34. If the solvent is passed through the filter unit 34 at a slow speed, trapping of particles due to intermolecular force is enhanced, so that removal efficiency is increased and thus the cleanliness of the solvent can be improved.

The above advantageous effect can be achieved if the liquid treatment apparatus is configured to perform a liquid treatment to the whole surface of a wafer by supplying an organic solvent from a nozzle unit having a plurality of nozzles aligned in a row in a wafer-width direction while the nozzle unit is traversing the wafer, without rotating the wafer.

The liquid treatment apparatus may be embodied as a developing apparatus, instead of the foregoing resist coating apparatus. In developing a negative resist, specific areas of an exposed resist film, which are not exposed to the exposure light, are dissolved or removed selectively to form a pattern. The negative resist developing process includes a liquid film forming step that supplies a developing liquid containing a solvent onto a substrate rotating at a constant speed to form a liquid film of the developing liquid, and a developing step that dissolves the resist film by the liquid film of the developing liquid. The liquid film forming step and the developing step are each performed plurality of times alternately and repeatedly so that the resist film is developed.

Figure 10:
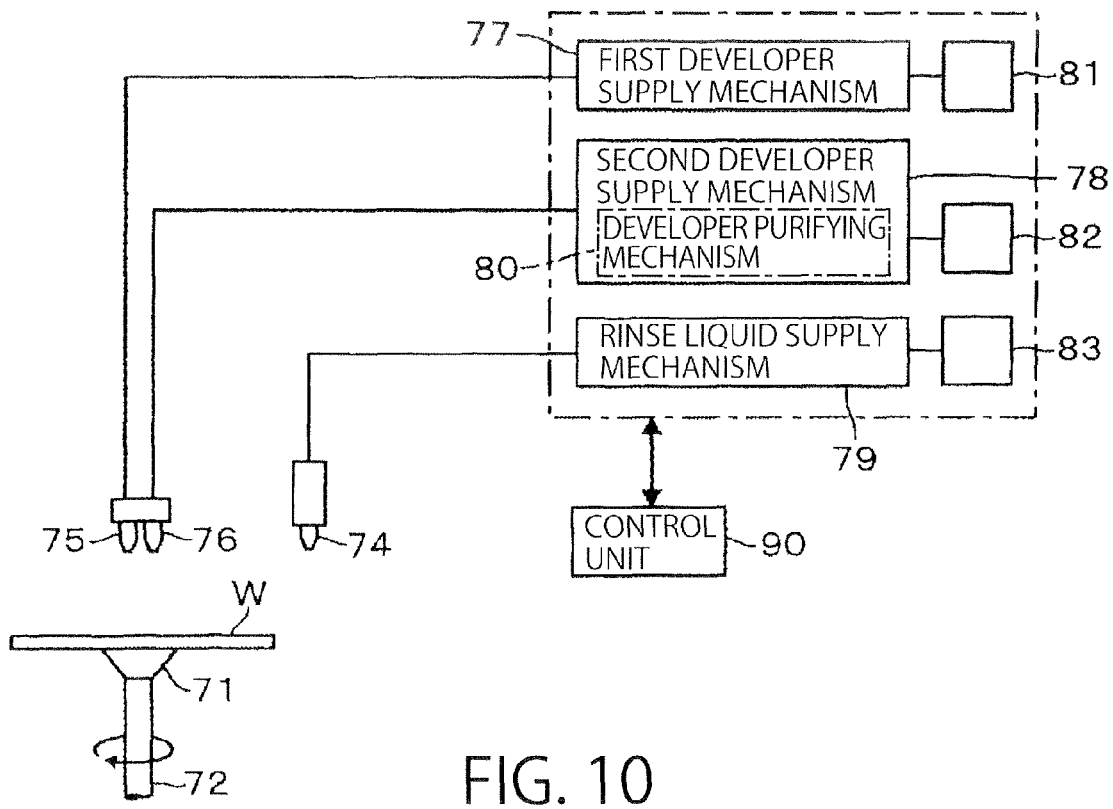
FIG. 10 is a schematic configuration diagram of a developing apparatus, as one embodiment of a liquid treatment apparatus.

As shown in FIG. 10, similar to the foregoing resist coating apparatus, the developing apparatus has a spin chuck 71 that holds a wafer W horizontally and is rotated via a rotary shaft 72 about a vertical rotation axis. Similar to the first embodiment, a cup body, which may have a configuration similar to that of the cup body 24 in the first embodiment, is provided about the spin chuck. A nozzle unit 73 is provided above the wafer W held by the spin chuck to supply a developing liquid to the wafer W.

The nozzle unit 73 has a first developer nozzle 75 for supplying a first developing liquid having a lower cleanliness and a second developer nozzle 76 for supplying a second developing liquid having a higher cleanliness. The first developer nozzle 75 is connected to a developer supply source 81 through a first developer supply mechanism 77. The second developer nozzle 76 is connected to a developer supply source 82 through a second developer supply mechanism 78. The second developer supply mechanism 78 has a developer purifying mechanism (i.e., solvent purifying mechanism) 80, which includes a circulation passage allowing the developing liquid to pass through a filter unit plural times repeatedly. The developing apparatus has a rinse liquid nozzle 74 that can be positioned above a wafer W held by a spin chuck 71 to supply a rinse liquid to the wafer W. The rinse liquid nozzle 74 is connected to a rinse liquid supply source 83 through a rinse liquid supply mechanism 79. The rinse liquid nozzle 74, as well as the nozzle unit 73, can move along a guide rail and move vertically by an elevating mechanism. The developing apparatus also has a control unit 90 for controlling the operation (including a series of treatment steps) of the developing apparatus.

Figure 11:
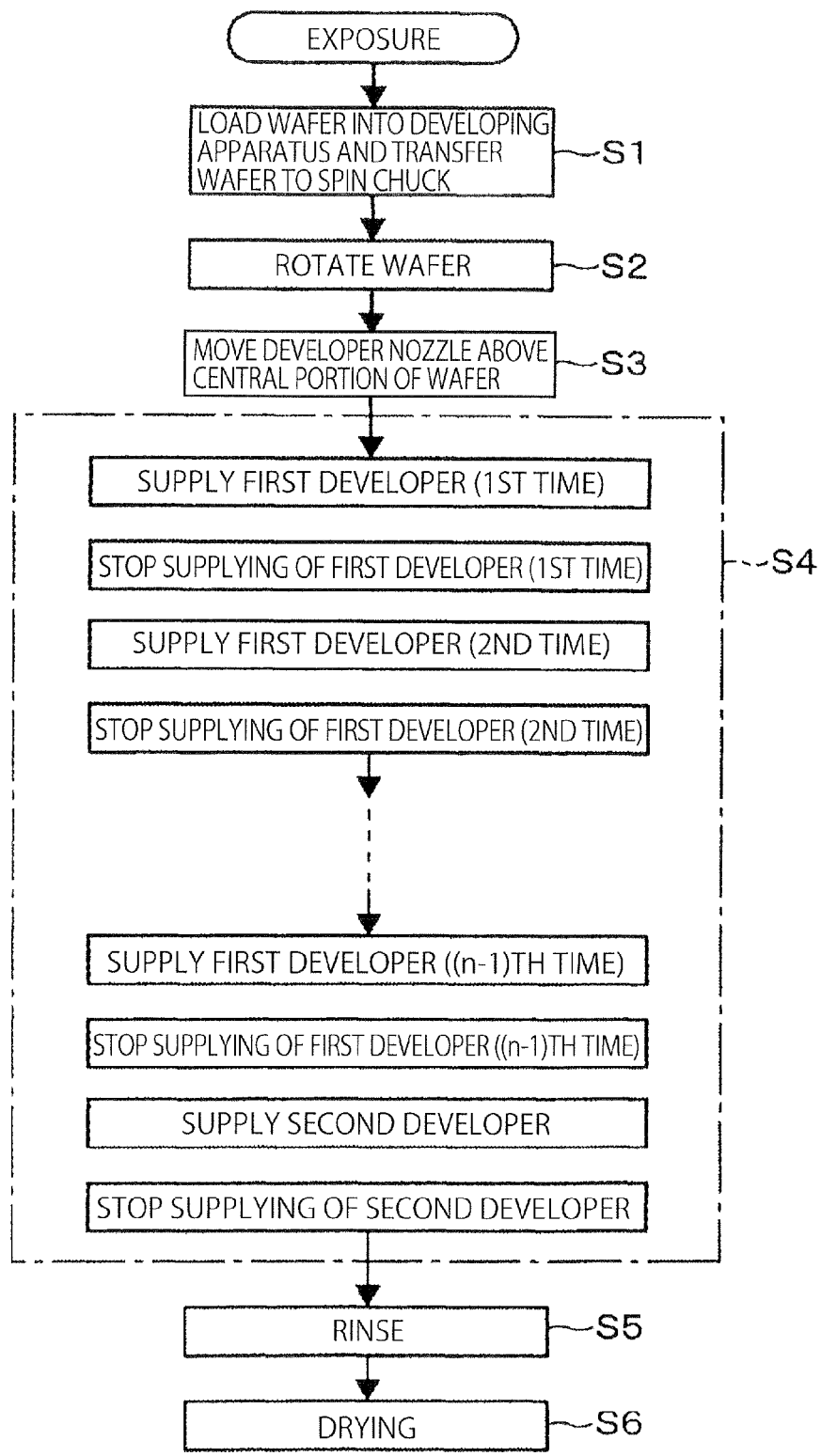
FIG. 11 is a flowchart showing process steps of a negative resist developing process using the developing apparatus shown in FIG. 10.

A series of treatment steps is described with reference to the flowchart in FIG. 11. A wafer W after being subjected to an exposure process is loaded into the developing apparatus (Step S1). Then, the wafer W starts rotating (Step S2), and the first developer nozzle 75 is moved to a position right above the central portion of the wafer W (Step S3). Then, a developing treatment step alternately and repeatedly performs a liquid film forming process and a developing process (Step S4). In the liquid film forming process, a developing liquid is supplied to the wafer W for 0.5 seconds while rotating the wafer W, so that a liquid film of the developing liquid is formed on the wafer W. In the developing process, the supplying of the developing liquid is stopped for 1.5 seconds, so that the resist film is dissolved, or developed. The liquid film forming process and the developing process are performed plural times (e.g., 8 times) alternately and repeatedly so that the developing treatment step is completed.

From the first liquid film forming process to the (n−1)th liquid film forming process ("n" is the total number of times of the first liquid film forming process to be performed in the developing treatment step), the first developing liquid having a lower cleanliness are supplied to the wafer W. The total amount of the first developing liquid is 23 ml for example. In the last nth liquid film forming process, 2 milliliters of the second developing liquid having a high cleanliness is supplied to the wafer W. After completion of the developing treatment step, a rinse treatment is performed to remove dissolved substances and particles remaining on the wafer W (Step 5). Then the wafer W is dried (Step 6), and unloaded from the developing apparatus by an external transfer arm.

In the developing apparatus of the foregoing embodiment, since the developing treatment step is performed using the first developing liquid having a lower cleanliness and thereafter using the purified, second developing liquid having a higher cleanliness, the amount of particles remaining on the wafer after completion of the developing treatment step can be reduced, while the ratio of the amount of the purified developing liquid consumption (e.g., 2 ml) to the total developing liquid consumption (e.g., 25 ml) can be reduced. It is thus not necessary to purify a large amount of developing liquid, so that reduction of the throughput is suppressed. In addition, since an amount of particles remaining on the wafer W after the developing treatment step is reduced, the rinsing time and/or the rinse liquid consumption in the step S5 can be reduced, or the rinse treatment step can be omitted.

In the developing treatment step, the first developing liquid may be supplied in the first to the mth liquid film forming process ("m" is a natural number smaller than "n"), and the second developing liquid may be supplied in the (m+1)th to the nth liquid film forming process. Alternatively, the first developing liquid may be supplied in the first to the (n−1)th liquid film forming process; and in the nth liquid film forming process, the second developing liquid may be supplied after supplying the first developing liquid. It should be noted that, from the first to (n−1)th liquid film forming process, a step of supplying the second developing liquid onto the wafer W may be included.

EXPERIMENTAL EXAMPLE

An experiment was performed to confirm the advantage of the foregoing embodiment. A liquid treatment apparatus having a configuration of the first embodiment was used. For each sample, a solvent(s) of high and/or low cleanliness was supplied to the central portion of a rotating wafer W (30 centimeter diameter), and then the wafer W was spin-dried by rotating the wafer W at 2000 rpm for 15 seconds. In Reference, only 2 milliliters of solvent having a high cleanliness was supplied to the wafer W. In Comparative Example, only 10 milliliters of solvent having a low cleanliness was supplied to the wafer W. In Example, after 10 milliliters of solvent having a low cleanliness was supplied to the wafer W, 2 milliliters of solvent having a high cleanliness was supplied to the wafer W. When dried, the number of particles of 40 nm size or larger remaining on each wafer W was counted. The solvent having a high cleanliness used in the experiment was obtained using a solvent supply mechanism having an essentially the same configuration as the second solvent supply mechanism 40 shown in FIG. 4. The solvent having a low cleanliness used in the experiment was obtained using a solvent supply mechanism having an essentially the same configuration as the first solvent supply mechanism 30 shown in FIG. 3.

Figure 12:
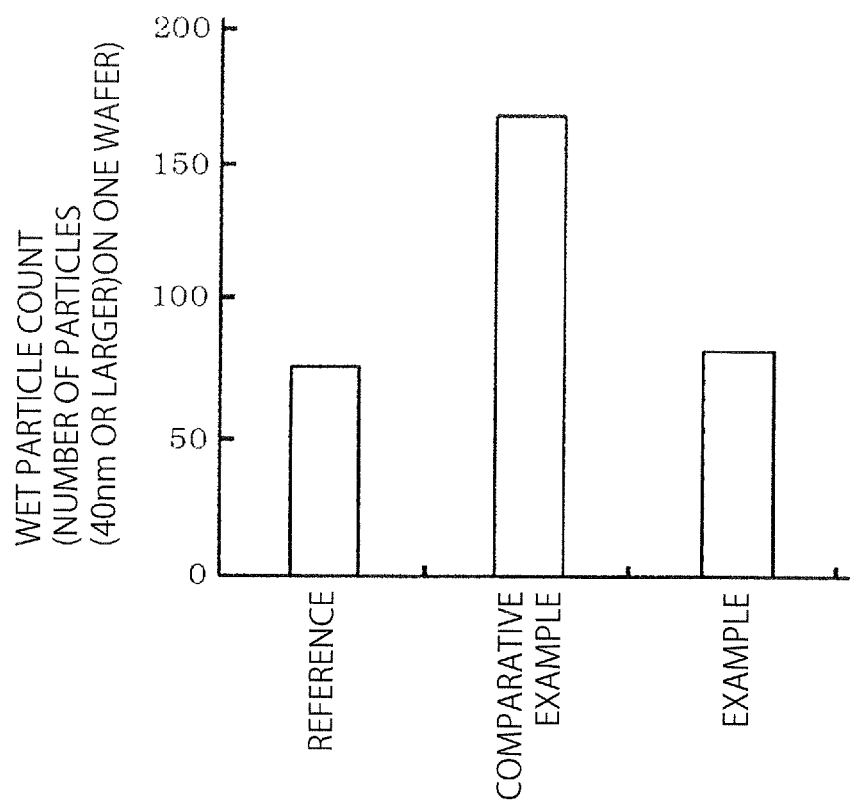
FIG. 12 is a graph showing the result of an experiment.

FIG. 12 shows the number of remaining particles (wet particle count) in "Reference", "Comparative Example", and "Example". In Comparative Example in which only a solvent of a low cleanliness (10 ml) was used for the treatment, 172 particles remained on the wafer. In Reference in which only a solvent of a high cleanliness (2 ml) is used for the treatment, 76 particles remained on the wafer. In Example in which a solvent having a high cleanliness (2 ml) was supplied to the wafer W after of a solvent having a low cleanliness (10 ml) was supplied to the wafer W, 82 particles remained on the wafer. That is, the particle level was improved in Example, similar to Reference. This result shows that, processing of a wafer with the solvent having a low cleanliness resulted in adhesion of a certain number of particles corresponding to the cleanliness level, however, the particles were washed away from the wafer by the solvent having a high cleanliness. That is, with the foregoing embodiment, the number of particles remaining on a wafer can be reduced, without increasing a consumption amount of a solvent having a high cleanliness, and thus while maintaining a high throughput.

The invention claimed is:

1. A liquid treatment method comprising:
supplying a first organic solvent to a substrate with the substrate being held horizontally by a substrate holder;
thereafter supplying a second organic solvent to the substrate held by the substrate holder, the second solvent passed through a filter at least one more time than the first solvent,
wherein the first organic solvent and the second organic solvent have the same composition and are different from one another only in a number of times filtered.

2. The liquid treatment method according to claim 1, wherein an amount of the second organic solvent supplied to the substrate is less than an amount of the first organic solvent supplied to the substrate.

3. The liquid treatment method according to claim 1, wherein the first organic solvent and the second organic solvent are supplied to the substrate using different nozzles.

4. The liquid treatment method according to claim 1, further comprising purifying an organic solvent to obtain the second organic solvent.

5. The liquid treatment method according to claim 4, wherein the purifying of the organic solvent is performed by circulating a solvent through a circulation passage provided therein with the filter.

6. The liquid treatment method according to claim 1, further comprising supplying a resist to the substrate wetted with the second organic solvent as a pre-wet liquid, after the supplying of the second organic solvent, wherein in the supplying of the second organic solvent, the second organic solvent is supplied to a central portion of the substrate with the substrate being rotated.

7. The liquid treatment method according to claim 1, wherein the first and second organic solvents are each a developing liquid for developing a negative resist film formed on the substrate.

8. A liquid treatment method comprising:
supplying a first organic solvent to a substrate with the substrate being held horizontally by a substrate holder;
thereafter supplying a second organic solvent to the substrate held by the substrate holder, the first solvent passed through a first particle filter once and the second solvent passed through a second particle filter plural times, wherein the first organic solvent and the second organic solvent have the same composition and are different from one another only in a number of times filtered.

9. A liquid treatment method comprising:
supplying a first organic solvent to a substrate with the substrate being held horizontally by a substrate holder;
thereafter supplying a second organic solvent to the substrate held by the substrate holder, the second solvent having less particle content or less ionized metal content than the first solvent, wherein the first organic solvent and the second organic solvent have the same composition and are different from one another only in a number of times filtered.

* * * * *